(12) United States Patent
Ashida (10) Patent No.: US 7,485,522 B2
(45) Date of Patent: *Feb. 3, 2009

(54) METHOD OF MANUFACTURING SEMICONDUCTOR DEVICE HAVING DUAL GATE ELECTRODE

(75) Inventor: Motoi Ashida, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/980,551

(22) Filed: Oct. 31, 2007

(65) Prior Publication Data

US 2008/0064159 A1    Mar. 13, 2008

Related U.S. Application Data

(63) Continuation of application No. 11/601,701, filed on Nov. 20, 2006, now Pat. No. 7,320,910, which is a continuation of application No. 10/724,618, filed on Dec. 2, 2003, now Pat. No. 7,145,205.

(30) Foreign Application Priority Data

May 15, 2003    (JP) ............................. 2003-137228

(51) Int. Cl.
   *H01L 21/8238*    (2006.01)
(52) U.S. Cl. ................ 438/199; 438/655; 257/E21.409
(58) Field of Classification Search ................ 438/199, 438/219, 655, 682, 683; 257/E21.409
   See application file for complete search history.

(56) References Cited

U.S. PATENT DOCUMENTS

| 4,412,239 A | 10/1983 | Iwasaki et al. |
| 4,851,257 A | 7/1989 | Young et al. |
| 5,066,995 A | 11/1991 | Young et al. |
| 5,656,524 A | 8/1997 | Eklund et al. |
| 5,847,988 A | 12/1998 | Babson et al. |
| 5,902,121 A | 5/1999 | Goto |
| 6,214,656 B1 | 4/2001 | Liaw |
| 6,602,746 B2 | 8/2003 | Tanaka |
| 6,646,306 B2 * | 11/2003 | Iwamatsu et al. ........... 257/347 |

(Continued)

FOREIGN PATENT DOCUMENTS

CN    1119346 A    3/1996

(Continued)

*Primary Examiner*—Tuan N. Quach
(74) *Attorney, Agent, or Firm*—McDermott Will & Emery LLP (57) ABSTRACT

Manufacturing of semiconductor device includes forming, at substrate main surface, PMOS and NMOS regions separated by PN film. Polysilicon is formed at surface. First insulating film serves as gate insulating film. Second insulating film is formed on polysilicon surface, in gate electrode region extending from PMOS to NMOS regions across PN film. Polysilicon layer is patterned with second insulating film, and first gate electrode extends from PMOS region surface to PN and second gate electrode extends from NMOS region to PN connecting to first gate electrode. At main surface, opposed first source and drain regions are formed by placing first gate electrode therebetween in plan view. At main surface, opposed second source and drain regions are formed by placing second gate electrode therebetween in plan view. The second insulating film, covering first and second gate electrodes is patterned and exposed on PN. Exposed first and second gate electrodes are silicidized.

1 Claim, 6 Drawing Sheets

U.S. PATENT DOCUMENTS

| | | |
|---|---|---|
| 6,781,207 B2 | 8/2004 | Kumeno |
| 6,881,672 B2 | 4/2005 | Breitwisch et al. |
| 7,274,073 B2 * | 9/2007 | Anderson et al. ........... 257/373 |
| 2007/0040222 A1 | 2/2007 | Van Camp et al. |

FOREIGN PATENT DOCUMENTS

| | | |
|---|---|---|
| JP | 59-107540 | 6/1984 |
| JP | 05-267599 | 10/1993 |

* cited by examiner

METHOD OF MANUFACTURING SEMICONDUCTOR DEVICE HAVING DUAL GATE ELECTRODE

RELATED APPLICATION

This application is a continuation of Application No.11/601,701,filed Nov. 20, 2006,now U.S. Pat. No. 7,320,910, which is a continuation of Application No. 10/724,618,filed Dec. 2, 2003,now U.S. Pat. No. 7,145,205,which claims priority of Japanese Patent Application No. 2003-137228,filed May 15, 2003,and the contents of which are herewith incorporated by reference.

BACKGROUND OF THE INVENTION

1. Field of the Invention

The present invention relates to a semiconductor device. More particularly, the present invention relates to a semiconductor device with a complementary metal oxide semiconductor (CMOS) transistor.

2. Description of the Background Art

A CMOS transistor is a transistor where an NMOS transistor and a PMOS transistor are paired. A dual-gate electrode is a single continuous gate electrode used as a common gate electrode by the NMOS and PMOS transistors. The dual-gate electrode in an area for configuring the NMOS transistor is formed of N+ polycrystal silicon while the dual-gate electrode in an area for configuring the PMOS transistor is formed of P+ polycrystal silicon.

Conventionally, for a semiconductor device with the CMOS transistor, particularly for a semiconductor device with the CMOS transistor adopting the dual-gate electrode, only the entire region of the active region, the dual-gate electrode and the interconnection is selectively silicided to connect the N+ polycrystal silicon portion and the P+ polycrystal silicon portion in the dual-gate electrode with low resistivity, by using a technique of siliciding a high-melting-point metal in a self-aligned manner. An example is disclosed in Japanese Patent Laying-Open No. 59-107540.

Since the entire region of the active region, the dual-gate electrode and the interconnection is conventionally silicided, an insulating film of identical shape with the dual-gate electrode cannot be formed such that it covers an upper side of the dual-gate electrode after silicidation. Accordingly, such an insulating film cannot be used as a stopper film to form a contact hole in a self-aligned manner.

Additionally, when the entire active region is silicided with the technique of siliciding a high-melting-point metal, a problem such as abnormal silicidation often causes electrical leakage between the active region and the well. Therefore, silicidation of the active region is not desirable.

SUMMARY OF THE INVENTION

An object of the present invention is to provide a semiconductor device having a CMOS transistor device with a dual-gate electrode, in which a contact hole can be formed in a self-aligned manner and electrical leakage between the active region and the well can be eliminated.

In order to achieve the object described above, a semiconductor device in accordance with the present invention includes: a semiconductor substrate having two types of active regions that are a PMOS region and an NMOS region separated from each other in plan view by a PN separation film, and a dual-gate electrode extending linearly across the PMOS region, the PN separation film and the NMOS region collectively on an upper side of the semiconductor substrate. The dual-gate electrode includes: a P-type portion positioned on the PMOS region; an N-type portion positioned on the NMOS region; and a PN junction positioned between the P-type portion and the N-type portion. The PN junction includes a silicide region having been subjected to silicidation. The silicide region is apart from both the PMOS region and the NMOS region and formed within the area of the PN separation film.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

First Embodiment

Figure 1:
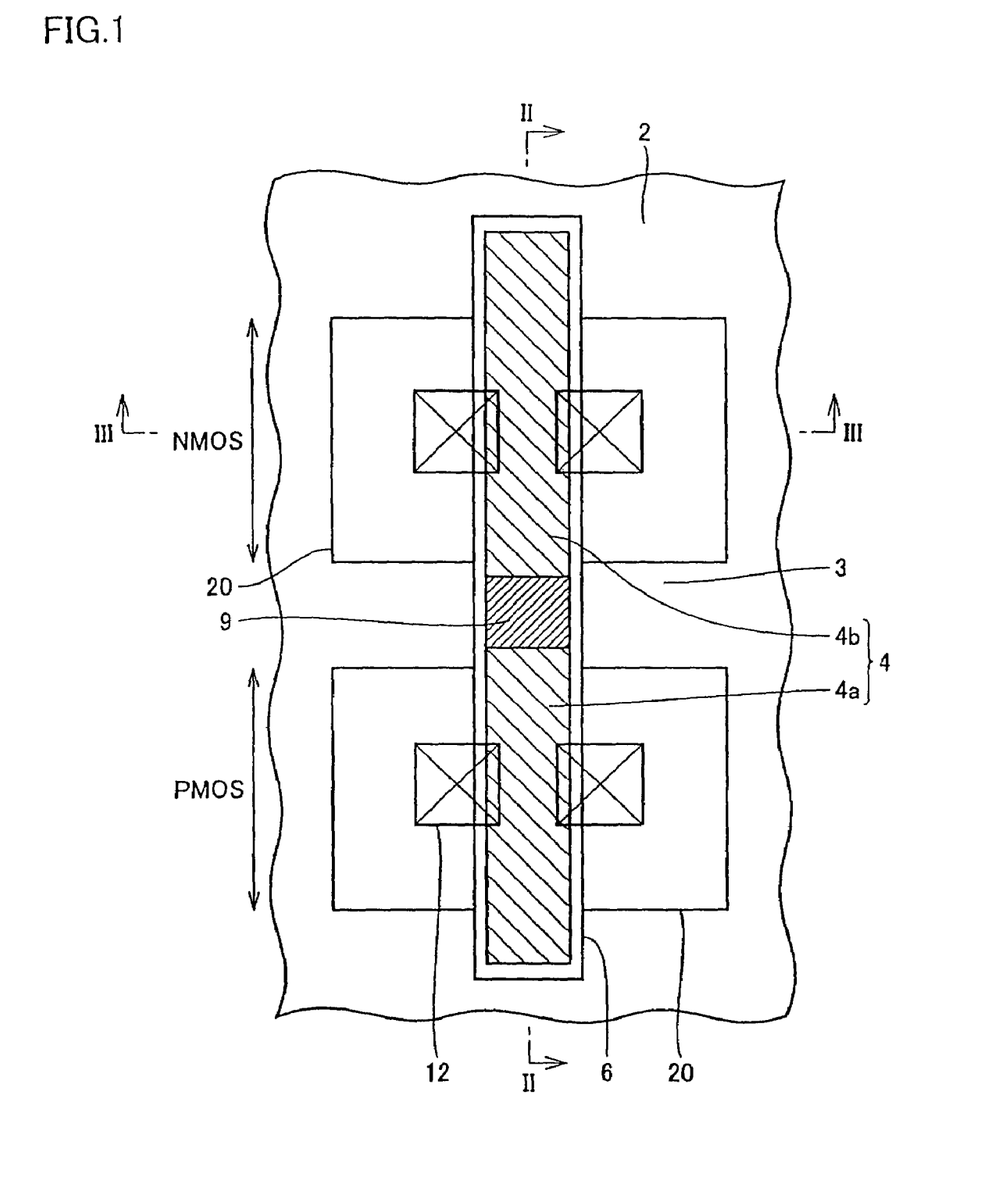
FIG. 1 is a plan view of a semiconductor device in a first embodiment in accordance with the present invention.
Figure 2:
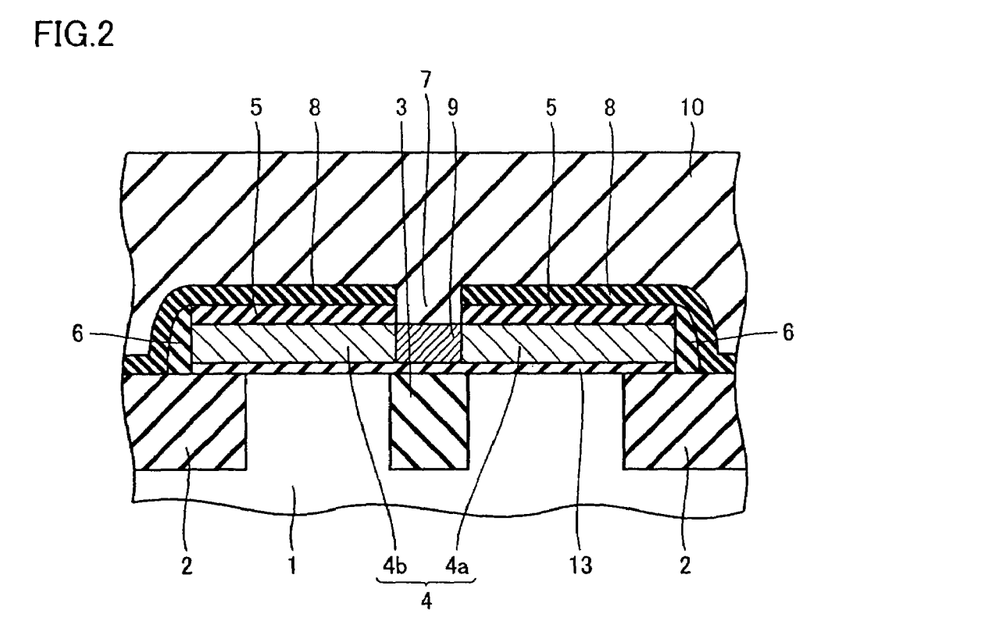
FIG. 2 is a cross section taken along a line II-II in FIG. 1.
Figure 3:
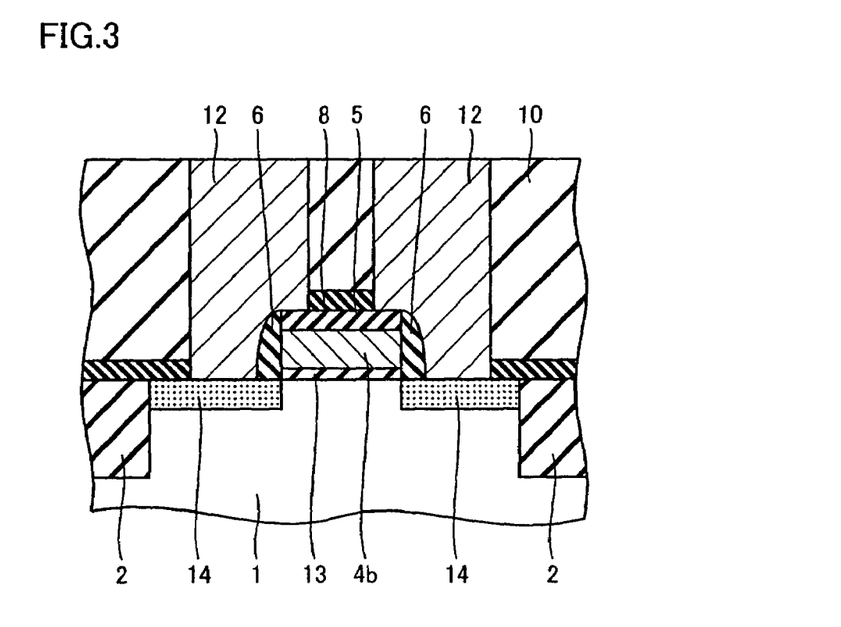
FIG. 3 is a cross section taken along a line III-III in FIG. 1.

Referring to FIGS. 1 to 3, a semiconductor device of a first embodiment in accordance with the present invention will be described. In FIG. 1, for convenience of description, a silicidation prevention film 8 and a gate-etching mask 5 which cover an upper side of a dual-gate electrode 4 are not shown in order that dual-gate electrode 4 can directly be seen. FIG. 2 is a cross section taken along a line II-II in FIG. 1. FIG. 3 is a cross section taken along a line III-III in FIG. 1. The semiconductor device includes a semiconductor substrate 1 and dual-gate electrode 4 as shown in FIGS. 2 and 3. The surface of semiconductor substrate 1 is partially covered with a separation insulating film 2. Semiconductor substrate 1 has two types of active regions 20, i.e., a PMOS region and an NMOS region that are separated from each other in plan view, namely as seen from the above, by a PN separation film 3 which is a part of separation insulating film 2.

Dual-gate electrode 4 extends linearly across the PMOS region, PN separation film 3 and the NMOS region collectively on an upper side of semiconductor substrate 1. Dual-gate electrode 4 includes a P-type polycrystal silicon portion 4a which is a P-type portion positioned on the PMOS region, and an N-type polycrystal silicon portion 4b which is an N-type portion positioned on the NMOS region. Dual-gate electrode 4 further includes a PN junction positioned between P-type polycrystal silicon portion 4a and N-type polycrystal silicon portion 4b. The PN junction includes a silicide region 9. The silicide region is a silicided region. Silicide region 9 is positioned apart from the PMOS region and the NMOS region and within the area of PN separation film 3 in plan view.

FIG. 1 shows contacts 12 by symbols. Contacts 12 are provided for ensuring electrical connection for active regions 20, and are formed in active regions 20 such that dual-gate electrode 4 is positioned between them in plan view. Contacts 12 are positioned to overlap dual-gate electrode 4 in plan view.

As shown in FIG. 2, dual-gate electrode 4 is covered with a sidewall insulating film 6 and then with a silicidation prevention film 8 thereon, except for the PN junction. At the PN junction, in the absence of sidewall insulating film 6 and silicidation prevention film 8, a salicide opening 7 is formed. Silicide region 9 is exposed inside salicide opening 7. As shown in FIG. 3, silicidation prevention film 8 is not formed in an area where contacts 12 overlap dual-gate electrode 4. However, dual-gate electrode 4 is covered with sidewall insulating film 6 to ensure electrical insulation from contacts 12.

The entire region of dual-gate electrode 4 is substantially covered with silicidation prevention film 8 except for silicide region 9. With this configuration, silicidation can conveniently be performed in a self-aligned manner as described below.

Function and Effect

The semiconductor device in this embodiment has a CMOS transistor device with dual-gate electrode 4. Silicide region 9 of dual-gate electrode 4 is formed at the PN junction only while the other portions thereof are covered with sidewall insulating film 6. Consequently, a contact hole can be formed in a self-aligned manner; actually, the semiconductor device has contacts 12 formed in a self-aligned manner. In this semiconductor device, silicidation of the entire active regions 20 is unnecessary, which can eliminate electrical leakage between the active regions and the well.

In particular, in this semiconductor device, silicide region 9 is positioned apart from both the PMOS region and the NMOS region and within the area of PN separation film 3 in plan view. Such configuration is preferred to prevent electrical leakage between silicide region 9 and active regions 20.

In this semiconductor device, contacts 12 are positioned to overlap dual-gate electrode 4 in plan view. If contacts 12 are positioned apart from dual-gate electrode 4, however, the effect of the present invention can be exhibited to a certain degree. However, when the present invention is applied, contacts 12 can be formed to overlap dual-gate electrode 4. Since this can reduce an area occupied by the transistor, such overlapping configuration is preferred. According to an estimation, as compared with the conventional configuration where the contacts are required to be positioned apart from the dual-gate electrode, it has been found that the configuration of the embodiment of the present invention can reduce the area occupied by the transistor by approximately 30% since the contacts are positioned to overlap the gate electrode.

Additionally, contacts 12 are positioned to avoid silicide region 9 in plan view. In other words, contacts 12 are positioned not to overlap silicide region 9. Such configuration is preferred to prevent electrical leakage between suicide region 9 and contacts 12. Contacts 12 are also positioned to avoid PN separation film 3 in plan view. Such configuration is preferred to efficiently ensure electrical connection of active regions 20 by contacts 12.

Silicidation prevention film 8 preferably includes a silicon nitride film because it is easily formed and formed of an appropriate material for preventing silicidation of the electrode portion.

Figure 4:
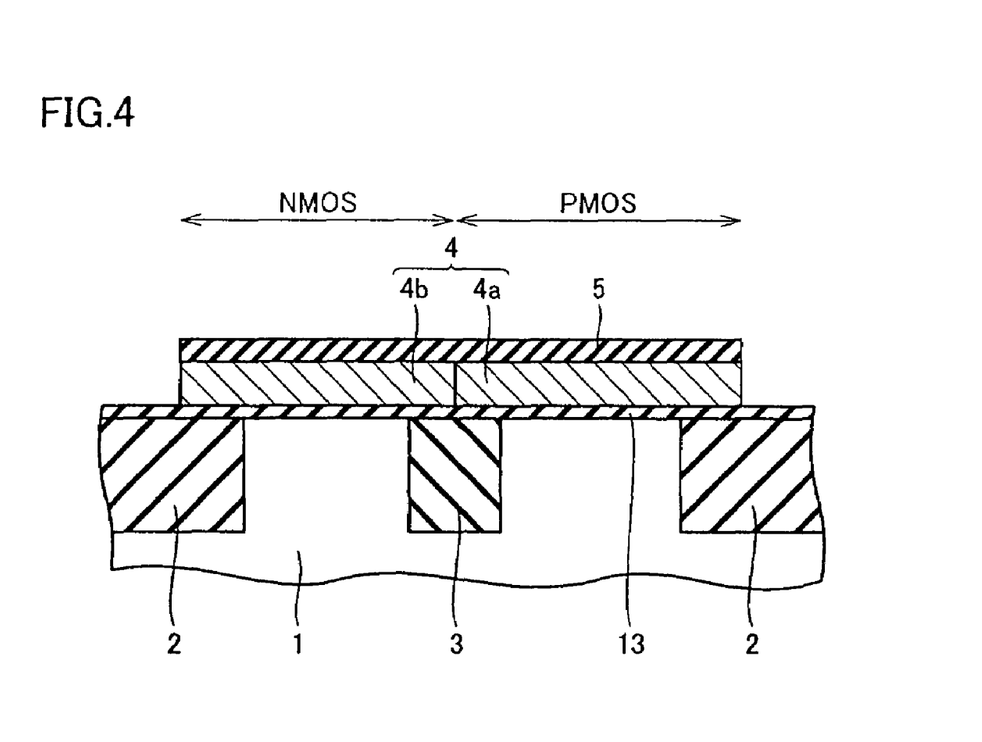
FIG. 4 is a vertical cross section in a first step of a method of manufacturing a semiconductor device in the first embodiment in accordance with the present invention.
Figure 5:
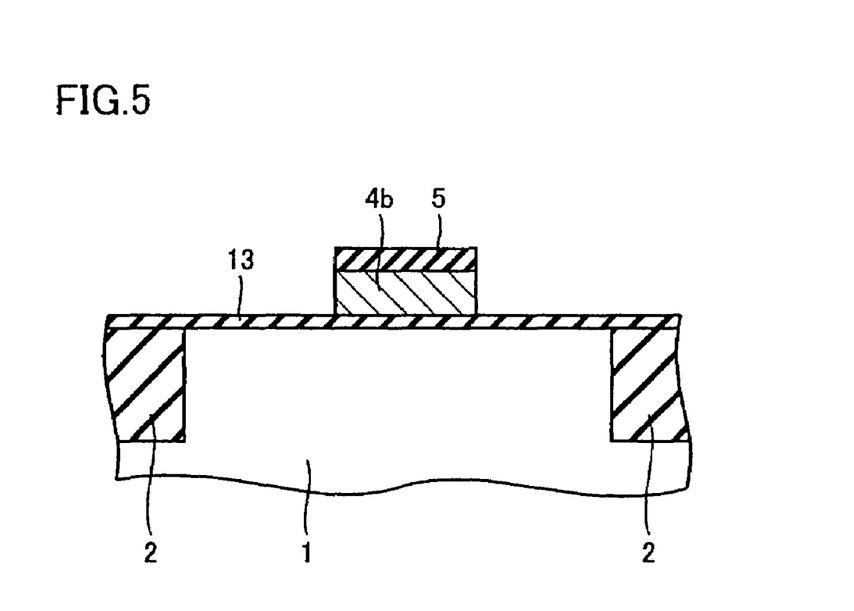
FIG. 5 is a transverse cross section in the first step of the method of manufacturing a semiconductor device in the first embodiment in accordance with the present invention.
Figure 6:
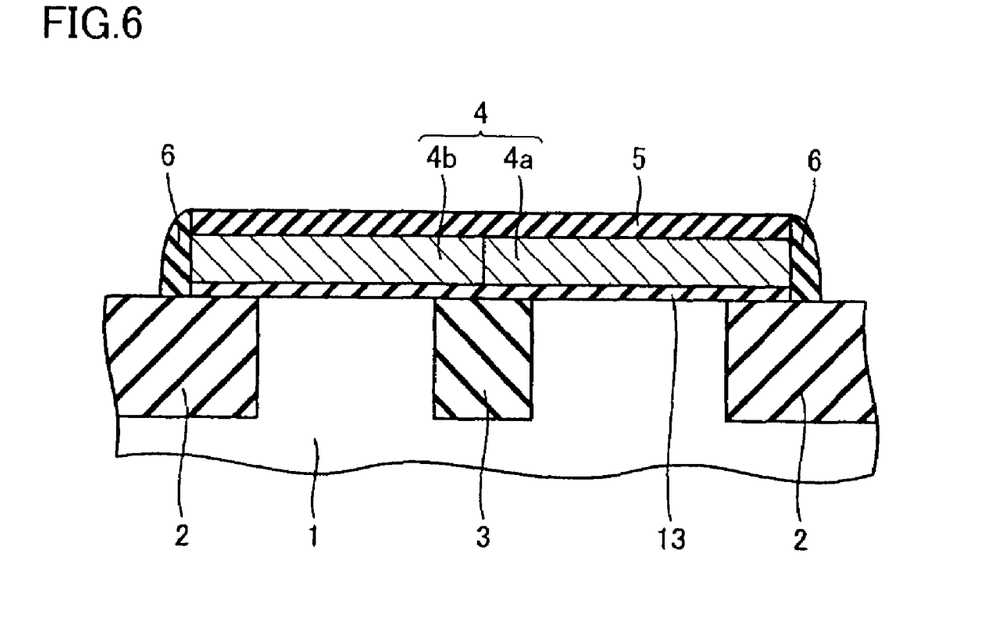
FIG. 6 is a vertical cross section in a second step of the method of manufacturing a semiconductor device in the first embodiment in accordance with the present invention.
Figure 7:
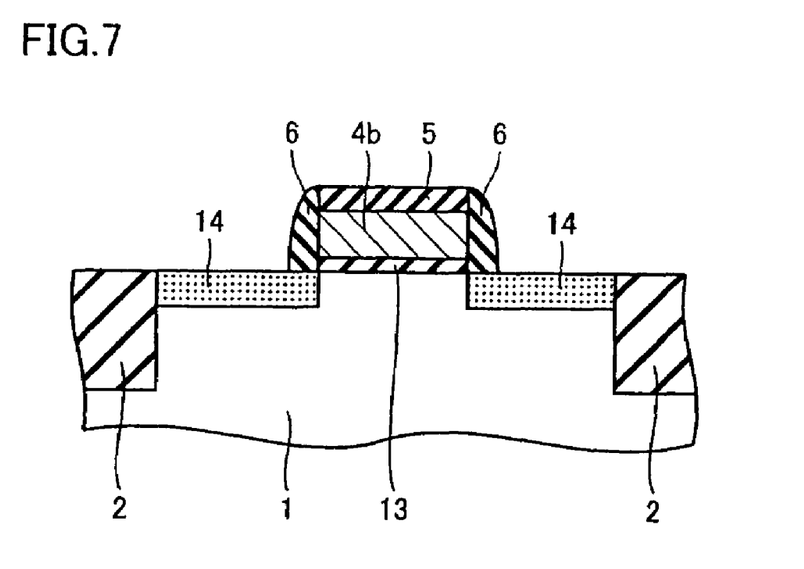
FIG. 7 is a transverse cross section in the second step of the method of manufacturing a semiconductor device in the first embodiment in accordance with the present invention.
Figure 8:
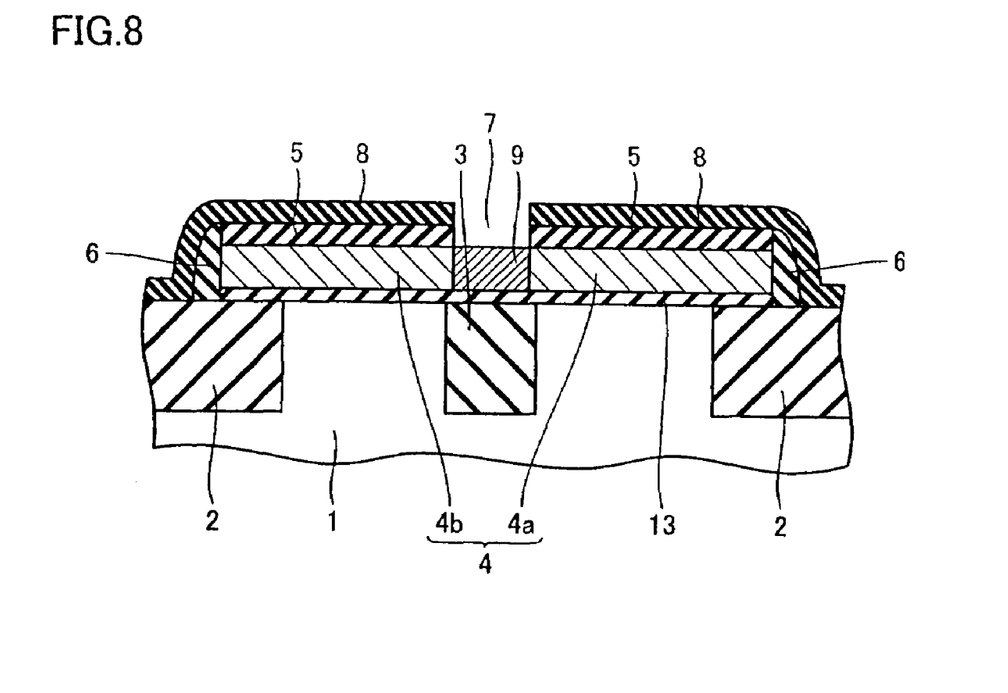
FIG. 8 is a vertical cross section in the third step of the method of manufacturing a semiconductor device in the first embodiment in accordance with the present invention.
Figure 9:
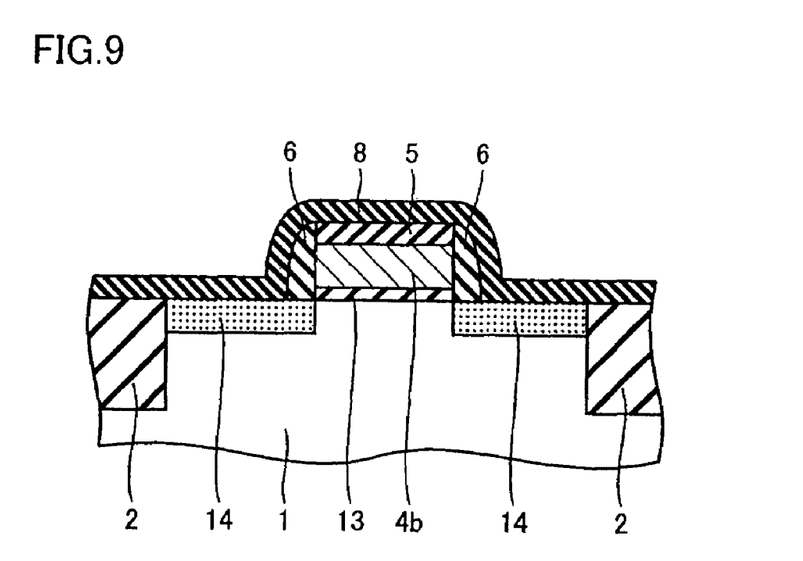
FIG. 9 is a transverse cross section in the third step of the method of manufacturing a semiconductor device in the first embodiment in accordance with the present invention.

Referring to FIGS. 4 to 8, FIG. 2 and FIG. 3, a method of manufacturing a semiconductor device according to this embodiment will be described. FIGS. 4, 6 and 8 are cross sections seen in the same direction as that of FIG. 2. FIGS. 5, 7 and 9 are cross sections seen in the same direction as that of FIG. 3.

As shown in FIGS. 4 and 5, a gate oxide film 13 is formed on an upper surface of semiconductor substrate 1. A polycrystal silicon film is then formed thereon as a material to form dual-gate electrode 4. The polycrystal silicon film is formed by a known technique such that N-type polycrystal silicon is formed in the NMOS region while P-type polycrystal silicon is formed in the PMOS region. An insulating film including a silicon nitride film is then formed to cover an upper side of the polycrystal silicon film. The insulating film is patterned to serve as gate-etching mask 5. Gate-etching mask 5 is used as an etching mask to pattern the polycrystal silicon film. As a result, a configuration of dual-gate electrode 4 is obtained as shown in FIGS. 4 and 5.

As shown in FIGS. 6 and 7, sidewall insulating film 6 is formed to cover a side of dual-gate electrode 4 covered with gate-etching mask 5. It is noted that, before sidewall insulating film 6 is formed, a source/drain region 14 is formed in the active region which is exposed to sandwich dual-gate electrode 4 in plan view.

As shown in FIGS. 8 and 9, silicidation prevention film 8 is formed to cover the upper side of the entire region of dual-gate electrode 4. Silicidation prevention film 8 is preferably formed of a silicon nitride film. Silicidation prevention film 8 and gate-etching mask 5 are removed by etching, for example, such that only the PN junction is exposed. As a result, salicide opening 7 is formed as shown in FIG. 8. Silicidation is then performed such that only the portion exposed at salicide opening 7 in dual-gate electrode 4 is silicided. Since the entire region of dual-gate electrode 4 is substantially covered with silicidation prevention film 8 except for the region to be silicided, silicidation can be performed in a self-aligned manner. As a result, silicide region 9 is formed as shown in FIG. 8.

As shown in FIGS. 2 and 3, an interlayer insulating film 10 is deposited thereon. Contact holes are formed in a self-aligned manner such that they overlap dual-gate electrode 4 in plan view with respect to interlayer insulating film 10. In forming the contact holes, silicidation prevention film 8 is used as a stopper film. The contact holes reach the surface of active regions 20 only in the area where they directly overlap active regions 20 in plan view. A conductive material fills the contact holes to form contacts 12. As a result, the semiconductor device shown in FIGS. 1 to 3 can be obtained.

Figure 10:
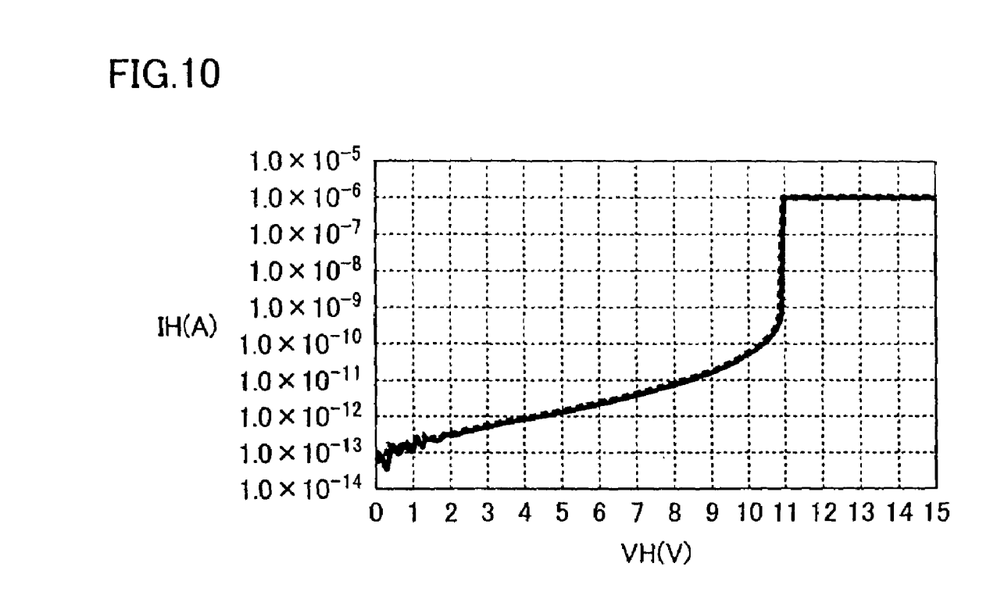
FIG. 10 is a graph showing the junction leakage characteristic of a semiconductor device in the first embodiment in accordance with the present invention.
Figure 11:
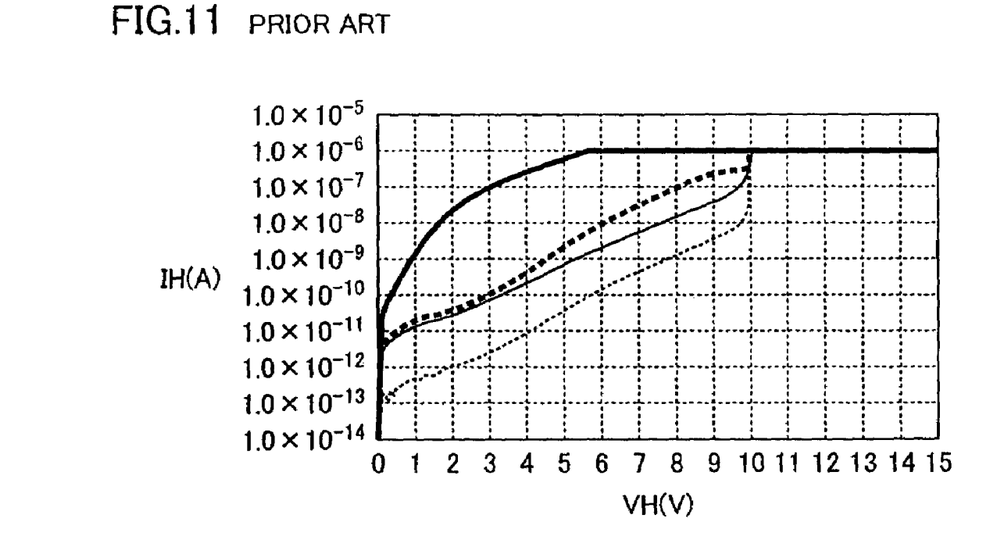
FIG. 11 is a graph showing the junction leakage characteristic of a conventional semiconductor device.

FIGS. 10 and 11 show a graph illustrating how a junction leakage current IH changes with respect to an applied voltage VH. Some conventional configurations having contacts overlapping a silicide region show a junction leakage current which varies as shown in FIG. 11. In contrast, a configuration to which the present invention is applied to have contacts without overlapping a silicide region shows a junction leakage current which varies to a smaller degree as shown in FIG. 10, and thus the junction leakage current can be controlled.

In accordance with the present invention, in a CMOS transistor device with a dual-gate electrode, contact holes can be formed in a self-aligned manner, and electrical leakage between the active regions and the well can be eliminated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, said semiconductor device comprising:
   a semiconductor substrate having two types of active regions that are a PMOS and an NMOS region separated from each other in plan view by a PN separation film;
   a first gate electrode of P-type polycrystal silicon extending across said PMOS region and extending over said PN separation film;
   first source and drain regions formed in said PMOS region at both sides of said first gate electrode;
   a second gate electrode of N-type polycrystal silicon extending across said NMOS region and extending over said PN separation film;
   second source and drain regions formed in said NMOS region at both sides of said second gate electrode;
   a first insulating film formed over said first gate electrode in said PMOS region;
   a second insulating film formed over said second gate electrode in said NMOS region;
   a first sidewall insulating film formed on a side surface of said first gate electrode and said first insulating film;
   a second sidewall insulating film formed on a side surface of said second gate electrode and said second insulating film;
   a silicide film formed over said PN separation film and having a first side contacting said first gate electrode and a second side contacting said second gate electrode;
   an interlayer insulating film formed over said first gate electrode, said first insulating film, and said first source and drain regions, and said interlayer insulating film having a contact hole overlapping one of said second source and drain regions and said second gate electrode in plan view; and
   a conductive material filled in said contact hole and electrically connected to said one of second source and drain regions,
   wherein said first and second sides of said silicide film are within said PN separation film in plan view and said first and second sides of said silicide film do not extend to said two types of active regions, and
   wherein said interlayer insulating film covers a whole surface of said silicide film; comprising the steps of:
   forming, at a main surface of a semiconductor substrate, active regions including a PMOS region and an NMOS region separated from each other by a PN separation film;
   forming a polysilicon layer at the main surface of said semiconductor substrate, with a first insulating film to serve as a gate insulating film interposed therebetween;
   forming a second insulating film on a surface of said polysilicon layer, in a gate electrode forming region extending from said PMOS region to said NMOS region across said PN separation film;
   patterning said polysilicon layer with said second insulating film serving as a mask, and forming a first gate electrode extending from a surface of said PMOS region to said PN separation film and a second gate electrode extending from said NMOS region to said PN separation film and connecting to said first gate electrode;
   forming, at the main surface of said semiconductor substrate, a first source region and a first drain region opposed to each other by allowing said first gate electrode to be placed therebetween in a plan view;
   forming, at the main surface of said semiconductor substrate, a second source region and a second drain region opposed to each other by allowing said second gate electrode to be placed therebetween in a plan view;
   patterning said second insulating film, covering said first and second gate electrodes on said active regions, and exposing said first and second gate electrodes on said PN separation film;
   silicidizing said first and second gate electrodes exposed from said second insulating film, wherein said step of silicidizing is performed from an upper surface of said polysilicon layer throughout in depth direction, and a silicide layer formed thereby allows said first and second gate electrodes to be connected; and
   after said step of silicidizing, forming an interlayer insulating film having a contact hole which is formed on surfaces of said first and second gate electrodes, said first and second source regions, said first and second drain regions, and a silicide layer formed by said step of silicidizing, and overlaps said second source region, said second drain region, and said second gate electrode in a plan view, wherein said contact hole is filled with a conductive substance.

* * * * *